US006690188B2

(12) United States Patent
Mess

(10) Patent No.: US 6,690,188 B2
(45) Date of Patent: *Feb. 10, 2004

(54) METHOD OF TESTING A SEMICONDUCTOR DEVICE

(75) Inventor: Leonard E. Mess, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 44 days.

(21) Appl. No.: 09/501,025

(22) Filed: Feb. 9, 2000

(65) Prior Publication Data

US 2001/0035763 A1 Nov. 1, 2001

Related U.S. Application Data

(62) Division of application No. 09/123,633, filed on Jul. 28, 1998.

(51) Int. Cl.$^7$ .............................................. G01R 31/28
(52) U.S. Cl. ........................................ 324/765; 324/755
(58) Field of Search ................... 324/765, 755, 324/761, 754, 73.1, 158.1; 438/14, 17, 18; 257/40, 48; 29/843; 361/779; 174/256

(56) References Cited

U.S. PATENT DOCUMENTS

| | | | | |
|---|---|---|---|---|
| 3,354,394 A | * | 11/1967 | James ......................... 361/761 |
| 4,329,642 A | | 5/1982 | Luthi et al. .................. 324/158 |
| 4,450,314 A | | 5/1984 | Huther ......................... 29/573 |
| 4,697,143 A | | 9/1987 | Lockwood et al. .......... 324/754 |
| 4,712,161 A | * | 12/1987 | Pryor et al. .................. 361/779 |
| 4,831,212 A | | 5/1989 | Ogata et al. |
| 4,900,948 A | | 2/1990 | Hamilton ..................... 307/149 |
| 4,961,052 A | | 10/1990 | Tada et al. .................... 324/754 |
| 5,016,138 A | | 5/1991 | Woodman ..................... 361/381 |
| 5,103,168 A | | 4/1992 | Fuoco ......................... 324/73.1 |
| 5,346,751 A | | 9/1994 | Lau et al. ..................... 428/210 |
| 5,424,652 A | * | 6/1995 | Hembree et al. ............. 324/765 |
| 5,519,332 A | | 5/1996 | Wood et al. .................. 324/755 |
| 5,530,376 A | * | 6/1996 | Lim et al. .................... 324/755 |
| 5,532,612 A | | 7/1996 | Liang |
| 5,578,934 A | | 11/1996 | Wood et al. .................. 324/755 |
| 5,621,333 A | * | 4/1997 | Long et al. ................... 324/762 |
| 5,625,298 A | * | 4/1997 | Hirano et al. ................ 324/754 |
| 5,644,247 A | | 7/1997 | Hyun et al. |
| 5,659,245 A | | 8/1997 | Ping et al. ................... 324/158.1 |
| 5,678,301 A | * | 10/1997 | Gochnour et al. ........... 324/765 |
| 5,693,980 A | | 12/1997 | Sugahara ..................... 257/706 |
| 5,796,246 A | | 8/1998 | Poh et al. .................... 324/73.1 |
| 5,915,755 A | | 6/1999 | Gochnour et al. ............ 29/843 |
| 6,037,957 A | | 3/2000 | Grande et al. ............... 347/147 |
| 6,291,265 B1 | | 9/2001 | Mess ........................... 438/107 |

OTHER PUBLICATIONS

Brady, et al., Materials Handbook, Thirteenth Edition, McGraw–Hill, New York, 1991 (unavailable month).

* cited by examiner

*Primary Examiner*—Vinh P. Nguyen
(74) *Attorney, Agent, or Firm*—Workman Nydegger

(57) ABSTRACT

A method testing a semiconductor device mounted upon an interposer. The interposer electrically couples the semiconductive device to an electrical apparatus and includes (i) a substrate comprised of an electrically insulating, thermally conductive ceramic material; and (ii) an electrical conductor on the substrate having a receiving end for connecting to the semiconductive device and a terminal end for connecting to the electrical apparatus. The semiconductive device is electrically coupled to the electrical apparatus when the semiconductive device is connected to the receiving end of the electrical conductor and the terminal end of the electrical conductor is connected to the electrical apparatus. A thermally conductive connector connects the semiconductive device to the interposer. The thermally conductive interposer and connector conduct heat from the semiconductive device to the environment, thereby protecting the semiconductive device from overheating.

27 Claims, 5 Drawing Sheets

METHOD OF TESTING A SEMICONDUCTOR DEVICE

RELATED APPLICATIONS

This is a divisional application of U.S. patent application Ser. No. 09/123,633, filed on Jul. 28, 1998, titled "THERMALLY CONDUCTIVE INTERPOSER AND METHOD" which is incorporated herein by reference.

BACKGROUND OF THE INVENTION

1. The Field of the Invention

This invention is in the field of semiconductive device technology. More specifically, this invention is in the field of interposers for electrically connecting semiconductive devices to an electrical apparatus.

2. The Relevant Technology

A semiconductive device is often electrically coupled to an electrical apparatus such as a computer through the use of an interposer. In one such process, the semiconductive device is connected to the interposer, which is then inserted into the socket of the electrical apparatus. The socket may be mounted on the motherboard of a computer, for example. Thus, the semiconductive device communicates electrically through the interposer with the electrical apparatus. Typical interposers currently employed in the coupling of semiconductive devices to electrical apparatuses are comprised of an FR4 fiberglass material, or the like, having electrically conductive metal lines or traces thereon.

The term "semiconductive device" extends to any device or assembly that includes circuitry defined in a semiconductive material, and further extends to a chip package that includes semiconductive material. The external and additional structure of a package assembly may be used, for example, for mounting the semiconductive device to a printed circuit board or other external circuitry, for establishing electrical connection between the semiconductive device and external circuitry, for improving the ease of handling or transporting the semiconductive device, and/or for protecting the semiconductive device from environmental conditions. Many chip packages include a lead frame that extends beyond the body thereof. The lead frame typically includes an array of electrical leads that extend from the internal circuitry of the integrated circuit to the exterior portion of the chip package where they are exposed to the surroundings.

Frequently, after a semiconductive device is manufactured, a testing process is conducted on the semiconductive device by subjecting it to a preselected set of input conditions in order to measure its response or other parameters. Testing of an integrated circuit package that includes a lead frame assembly is conventionally conducted by providing temporary electrical communication between the leads and testing circuitry. For example, such temporary electrical connection may be established by using a set of probes, pins, sockets, or the like, to contact the leads. The integrated circuit package may be clamped or otherwise secured in position during the testing operation in order for the leads to remain in electrical contact with the corresponding probes, pins, sockets, etc., of the testing circuitry.

Semiconductive devices, such as DRAMs and SRAMs, undergo significant stresses when in use. Particularly modern, high speed, advanced-integration semiconductive devices generate a significant amount of heat during use. This heat can degrade and slow down semiconductive devices. For example, testing of semiconductive devices to determine the quality and capability of the devices can generate such heat within the devices that the testing process itself damages the devices. Typical fiberglass interposers do not dissipate heat sufficient to protect semiconductive devices from the potential of damage caused by the heat generated during use of the device.

In addition, typical fiberglass interposers are made of glass fibers and epoxy resin. The resulting interposer has a coefficient of thermal expansion which is incompatible with typical semiconductive devices. The coefficient of thermal expansion of the fiberglass is often significantly greater than that of the semiconductive device.

As a result of this thermal expansion incompatibility, shear stresses develop in the interface between the interposer and the semiconductive device when the semiconductive device becomes hot. These shear stresses can result in a severing of the electrical connection between the interposer and the semiconductive device. While it is possible to ameliorate the effects of shearing through a process known as wire bonding, this process adds additional complexity and expense. Furthermore, the organic material within FR4 fiberglass interposers absorbs moisture, causing the interposers to degrade.

There is therefore a need in the art for an improved interposer which assists in protecting a semiconductive device coupled to the interposer from the potential damage caused by significant amounts of heat generated by the semiconductive device. There is also a need in the art for an improved interposer which prevents shear stress from severing the electrical connection between the interposer and the semiconductive device.

SUMMARY OF THE INVENTION

An interposer of the present invention is comprised of (i) a substrate comprised of an electrically insulating, thermally conductive ceramic material; and (ii) an electrical conductor on the substrate having a receiving end for connecting to a semiconductive device and a terminal end for connecting to an electrical apparatus. The semiconductive device is electrically coupled to the electrical apparatus when the semiconductive device is connected to the receiving end of the electrical conductor and the terminal end of the electrical conductor is connected to the electrical apparatus. The invention also includes thermally conductive connections between the semiconductive device and an interposer.

In one embodiment, a thermally conductive connector connects the semiconductive device, such as an SRAM, DRAM, or integrated circuit device, to the interposer such that a portion of the semiconductive device is exposed to the atmosphere to thereby dissipate heat to the atmosphere. Both the thermally conductive interposer and the thermally conductive connector act as heat sinks to conduct heat from the semiconductive device to the ambient, thereby protecting the semiconductive device from overheating. The interposer preferably has a coefficient of thermal expansion which is substantially similar to the coefficient of thermal expansion of a semiconductive device on the interposer, thereby preventing shearing of the electrical connection between the semiconductive device and the interposer.

In one embodiment, the semiconductive device is fastened temporarily and removably to the interposer and the interposer is coupled to an electrical apparatus. In another embodiment, the semiconductive device is permanently coupled to the interposer. As an example of a connector, a biasing clip enables quick and convenient placement and removal of semiconductive devices on the interposer. The interposer may be permanently or removably coupled to the electrical apparatus, depending on the desired application.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
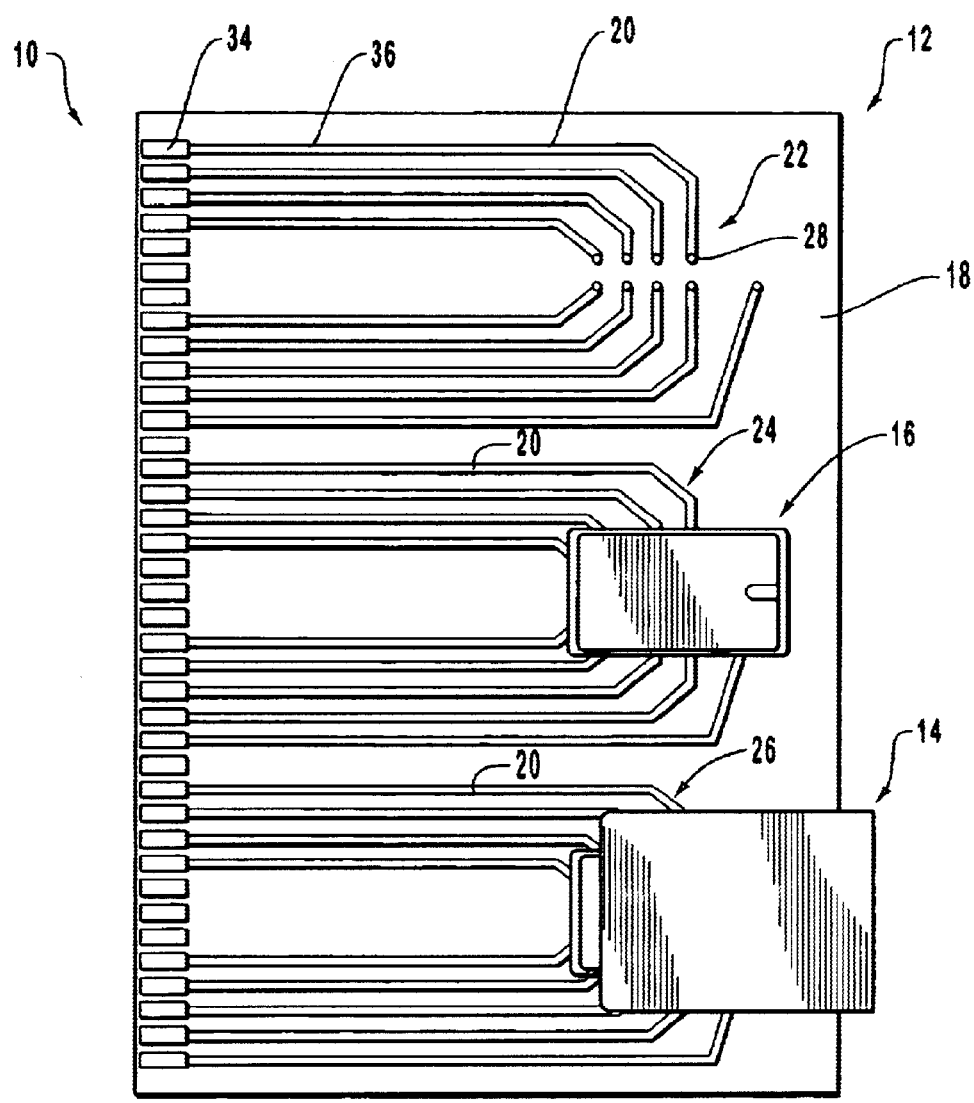
FIG. 1 is a perspective view of an interposer kit of the present invention showing one trace array empty, one trace array having a semiconductive device thereon, and one trace array having a semiconductive device thereon with a biasing connector coupling the semiconductive device to the interposer.
Figure 2:
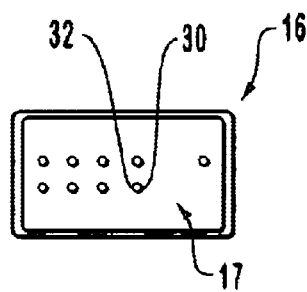
FIG. 2 is a bottom surface view of a semiconductive device.

With reference now to FIGS. 1 and 2, the present invention relates to an interposer system 10 comprising (i) an interposer 12; and (ii) a connector 14 for connecting a semiconductive device 16 to interposer 12. Interposer 12 is configured to electrically couple semiconductive device 16 to an electrical apparatus (not shown in FIG. 1), such as a testing apparatus which monitors, tests or evaluates device 16, by for example storing information on device 16 and retrieving information from device 16.

Interposer 12 is electrically coupled to the electrical connections 17 of device 16, the bottom surface of which is shown in FIG. 2, and to electrical connections on an electrical apparatus, thereby electrically coupling semiconductive device 16 to the electrical apparatus. By coupling semiconductive devices 16 on interposer 12, and coupling interposer 12 to the electrical apparatus, the electrical apparatus may perform a variety of functions upon the semiconductive devices, while the semiconductive devices are protected from overheating by the heat dissipating qualities of interposer 12.

Interposer 12 and preferably, connector 14, are thermally conductive. As shown in FIG. 1, system 10 preferably exposes semiconductive device 16 partially to the open atmosphere, rather than completely covering devices 16 with a connector, allowing heat to dissipate to the atmosphere directly from semiconductive device 16. In addition, heat is transferred through thermally conductive interposer 12 and connector 14 from semiconductive device 16, then dissipated to the atmosphere. The thermal conductivity of interposer 12 and connector 14, along with the configuration of interposer 12 and connector 14 are significant advantages within the art.

Interposer 12 will now be discussed in additional detail. Interposer 12 is comprised of a substrate 18 and a plurality of electrical conductors 20 on substrate 18. Substrate 18 is comprised of an electrically insulating material. Substrate 18 also conducts heat, thereby dissipating heat away from device 16 connected to substrate 18. When exposed to the high temperatures generated by advanced high density, high integration devices 16, substrate 18 does not warp or bow. Substrate 18 has formed thereon electrical conductors 20, such as metal traces. Substrate 18 also preferably has substantially similar thermal expansion properties as semiconductor device 16, such as a substantially similar coefficient of thermal expansion as that of semiconductive device 16. By having substantially similar thermal expansion properties, shear stress is reduced in the physical connections between device 16 and interposer 12 so as to prevent a severing of the electrical connection between device 16 and interposer 12.

In one embodiment, substrate 18 is comprised of a ceramic material, such as an inorganic ceramic material. Examples of ceramic materials used in the production of substrate 18 include glass. Many forms of glass may be used, including glass comprising silicates, silica, silicon oxide, phosphates, or borates, or derivatives thereof. Such glass may be doped with metal, an oxide or other elements, so long as it remains electrically insulative. Glass may be formed by fusing silica with a basic oxide, for example. Borophosphosilicate glass is one example of a material useful for substrate 18. Inorganic forms of glass are preferable. Glass materials often have substantially similar thermal expansion properties as semiconductive devices 16, which are often substantially comprised in the most part of silicon or other semiconductive material.

In addition to glass, other ceramics useful in the present invention as substrate 18 include alumina, aluminum nitrides, nonmetallic nitrides, nonmetallic carbides, single oxide ceramics, mixed oxide ceramics, and mixtures and derivatives thereof. As used throughout this specification and the appended claims, the term "nonmetallic nitrides" includes boron nitrides, silicon nitrides and other transitional element nitrides. Alumina, for example, may be used alone or in combination with silica or silicates, for example, because alumina resists harsh environments and also dissipates heat.

Other examples of ceramics useful in the present invention for substrate 18 include glass ceramics, such as nucleated glass having a nonporous, substantially crystalline structure, devitrified ceramics, or vitro ceramics. In one embodiment, glass ceramics are fine-grained substantially crystalline materials made through controlled crystallization from glass compositions containing nucleating agents. Thus, in one embodiment, substrate 18 comprises a material selected from the group consisting of glass, alumina, glass ceramic, aluminum nitride, nonmetallic nitride, nonmetallic carbide, and mixtures and derivatives thereof. Other possible, but less preferred ceramics for substrate 18 include refractories such as steatite and mullite.

Glass and other ceramics are preferably provided in a substantially homogeneous form for substrate 18, as opposed to the heterogeneous mixture of fibers and epoxy found in FR4 fiberglass. Glass and other ceramics are also preferably provided in substrate 18 in a substantially planar (i.e., flat) sheet, as shown in FIG. 1.

As shown in FIG. 1, interposer 12 includes a plurality of arrays 22, 24, 26 of electrical conductors 20 thereon. Each electrical conductor 20 has a receiving end 28 for connecting to a corresponding terminal 30 of an electrical conductor 32 on the bottom surface of semiconductive device 16 as shown in FIG. 2. Each electrical conductor 20 on substrate 18 further comprises a terminal end 34 for connecting to an electrical apparatus. An intermediate portion 36 of conductor 20 extends between receiving end 28 and terminal end 34 of each conductor 20. The connection of terminal end 34 to the electrical apparatus may be permanent or removable.

An interposer of the present invention may comprise a single conductor or a plurality of conductors. The interposer may have a single array of conductors or may have a plurality of arrays, such as arrays 22, 24, 26 as shown in FIG. 1. Each array may have as many conductors as needed to electrically couple a particular semiconductive device, such as device 16, to an electrical apparatus. Conductors may have a variety of different configurations any of which are designed to electrically couple a semiconductive device to an electrical apparatus. Heat dissipates to the environment through the conductors and from the conductors through the substrate to the ambient.

In one embodiment, the semiconductive device is permanently coupled to the interposer. The semiconductive device may be permanently coupled to the interposer through the use of an adhesive, for example, which is another example of a connector. In an underfilling process, adhesive is placed around the edges of semiconductive device 16 mounted on interposer 12, then the adhesive is permitted to wick through capillary action between interposer 12 and semiconductive device 16. This process can be repeated until the desired bond is achieved between interposer 12 and the semiconductive device 16. This underfilling process is often used for flip chips, for example. Preferably, the adhesive is a thermally conductive adhesive, such as a silver-filled epoxy, or a tape having acrylics filled with alumina or aluminum nitride with a matrix in resin. The thermally conductive adhesive enhances heat dissipation away from semiconductive device 16. Adhesives may be applied using a screen printing process, for example.

In another embodiment, semiconductive device 16 is removably coupled to interposer 12, such as when it is desired to test device 16 by coupling device 16 to testing apparatus which monitors, tests, and/or evaluates device 16. Preferably, when removability is desired, connectors such as resilient biasing connectors 14 are employed. As shown in FIG. 1, biasing connector 14 connects device 16 to interposer 12 such that a substantial portion of device 16 is exposed to the open environment, thereby assisting in dissipating heat from device 16.

Figure 3:
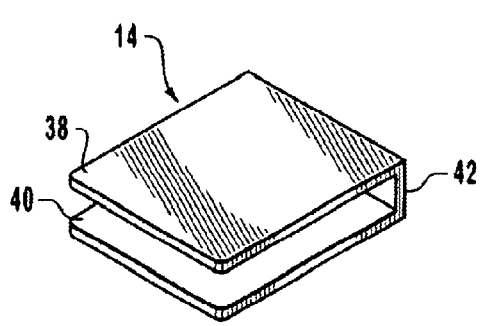
FIG. 3 is a perspective view of a biasing connector of the present invention.
Figure 4:
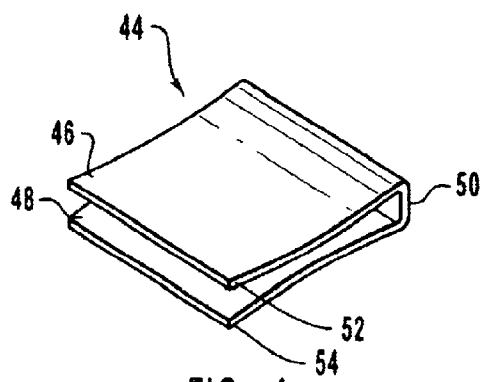
FIG. 4 is a perspective view of another embodiment of a biasing connector of the present invention.
Figure 5:
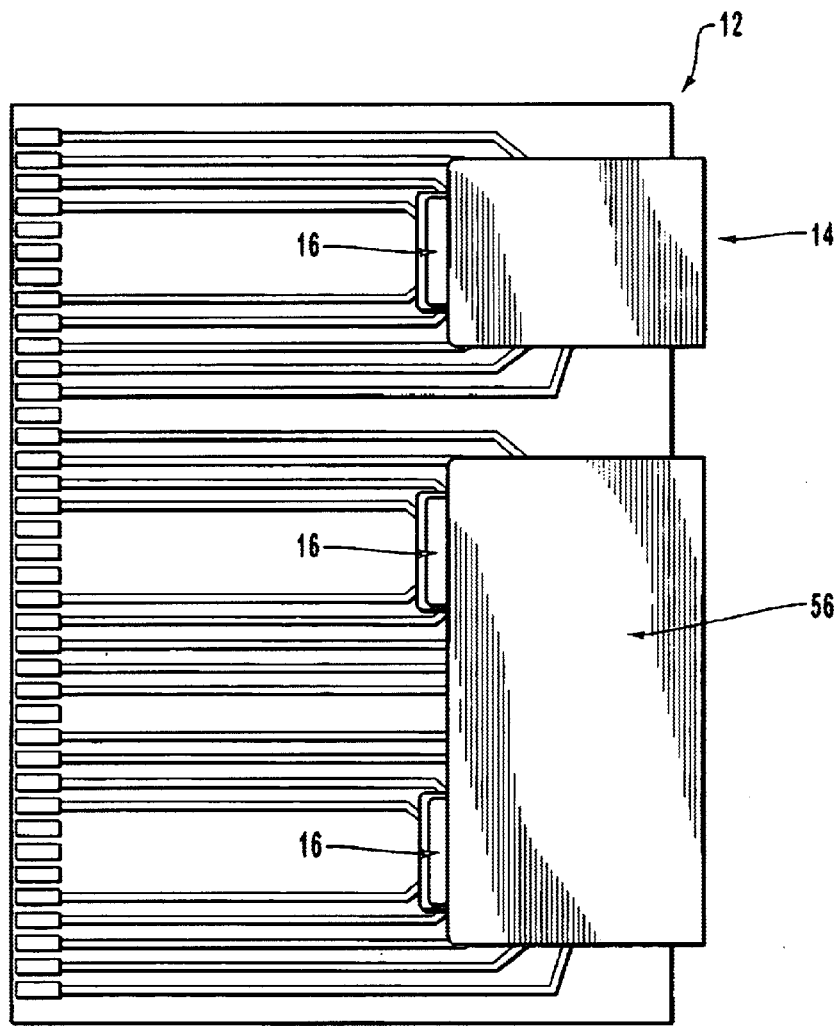
FIG. 5 is a perspective view of the interposer kit shown in FIG. 1 with an additional biasing connector and semiconductive device placed thereon.

With reference now to FIGS. 3, 4, and 5, various embodiments of biasing connectors are demonstrated. As shown in FIG. 3, connector 14 comprises a resilient clip having a top plate 38, a bottom plate 40, and an intermediate portion 42 coupling top plate 38 to bottom plate 40. Connector 14 may be employed to resiliently, removably bias semiconductive device 16 against interposer 12.

Another embodiment of a connector 44 is demonstrated in FIG. 4. Connector 44 comprises a resilient clip having an upper plate 46, a lower plate 48 and an intermediate portion 50 coupling upper plate 46 to lower plate 48. Each of plates 46, 48 include a bow in the central portion thereof. The bow in plates 46, 48 allowing front ends 52, 54 of clip 44 to be readily biased open and closed manually for placement over device 16 and substrate 12.

As shown in FIG. 5, in one embodiment one connector 14 is used for a single semiconductive device 16, whereas in another embodiment a single connector 56 is used to couple a plurality of semiconductive devices 16 to interposer 12. Connector 56 may be in the shape of clip 14, clip 44, or a variety of other clips or other configurations. A variety of different designs of connectors may be employed in the present invention such as other clips, crimps, clamps and a variety of other connectors having shapes and configurations which allow them to resiliently, removably bias semiconductive devices 16 to interposer 12.

In a preferred embodiment, heat is also conducted through a thermally conductive connector to the environment. Biasing connectors 14, 44, and 56 are preferably comprised of a resilient, heat dissipating material such as copper, copper alloy, or another metal. The connectors are also insulated from the electrical connections on devices 16, such as by being further comprised of or coated with an electrically insulating material, such as glass or polymer or by being placed on electrically insulating portions of devices 16. The connectors thus resiliently, removably bias semiconductive devices 16 against interposer 12 while simultaneously assisting in dissipating the heat generated by devices 16 in conducting the heat to the atmosphere. These connectors do so in a manner which allows a portion of the device itself to be exposed to the atmosphere, thereby increasing the dissipative qualities of system 10.

Connectors 14, 44, 56 dissipate heat because they are in intimate thermal contact with devices 16 and because they are comprised of a thermally conductive material. Connectors 14, 44, 56 and other such connectors may be placed on device 16 manually or automatically. One advantage of such connectors over an underfilling process is that the connectors do not need a delay time in which wicking occurs and they avoid the further delay of repeated applications, as well as delays associated with curing of the adhesive.

Connectors 14, 44, 56 or a variety of substantially similar connectors may also be employed to assist in permanently coupling devices 16 to substrate 18, thereby providing heat dissipation. For example, it is possible to employ both an adhesive, such as a thermally conductive adhesive and a connector, such as connector 14, 44, or 56 to permanently couple semiconductive device 16 to interposer 12. This may be accomplished, for example, by placing adhesive between substrate 18 and semiconductive device 16 with a connector 14, 44, or 56 to couple both substrate 18 and device 16 together and/or by placing the adhesive between connector 14, 44, or 56 and substrate 18, for example. Adhesive may also be placed between connector 14, 44, or 56 and device 16 so long as the electrical connections between connector 14, 44, or 56 and device 16 are preserved.

Figure 10:
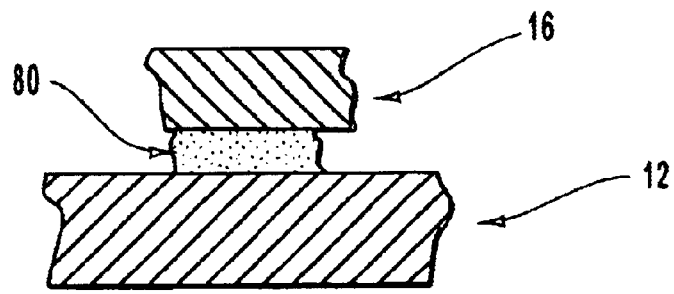
FIGS. 10, 11, and 12, schematically show three vertical cross sectional views of embodiments of the present invention that include an adhesive.
Figure 11:
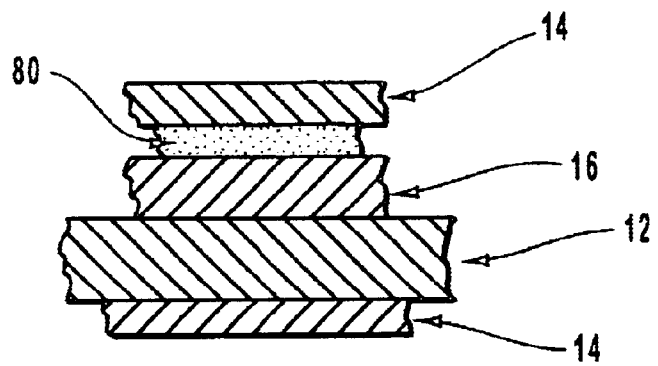
Figure 12:
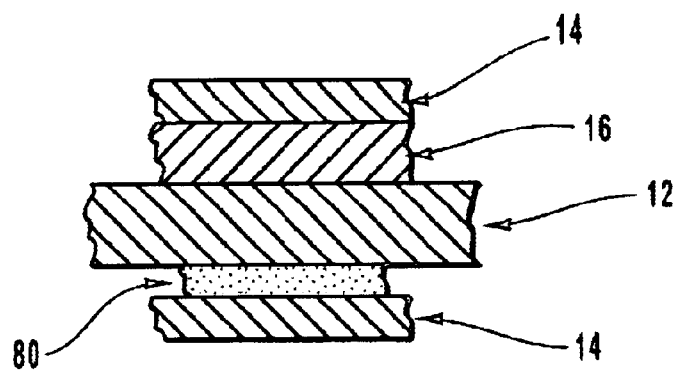

Three of the various embodiments that include adhesive 80 as described above are schematically shown in FIGS. 10–12.

Conductors 20 may be conventionally formed on substrate 18 by being attached or deposited thereon. For example, a metal can be sputtered onto substrate 18, followed by a patterning process to define conductors 20. Other conventional metallizing or metal line deposition processes can also be used. In one embodiment, substrate 18 is initially etched, after which the etched portion is metallized, by metal deposition and a metal line patterning process. Metal deposition and photolithographic metallization processes may be used to etch fine line widths and to place conductors in dense arrays on substrates to form interposers.

Figure 6:
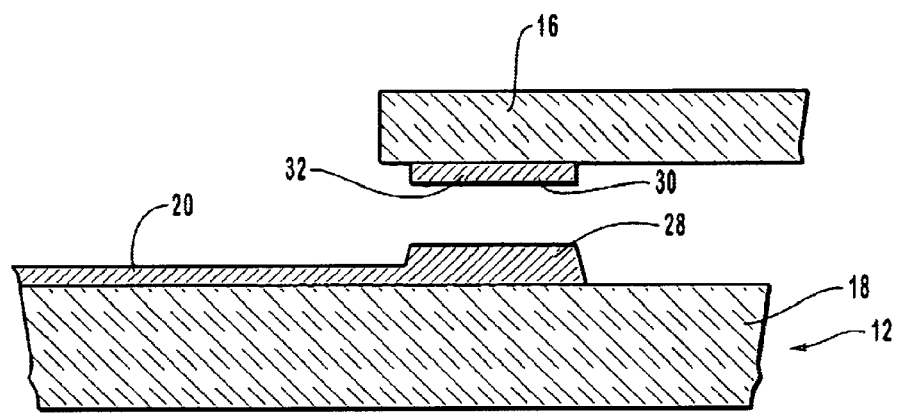
FIG. 6 is a cross-sectional, cut-away view of the semiconductive device and the interposer shown in FIG. 1.

As shown in FIG. 6, in one embodiment, electrical conductor 20 has a bumped receiving end 28 which projects from the upper surface of substrate 18. In this embodiment, semiconductive device 16 includes a corresponding electrical conductor 32 having a bumped terminal 30 which couples to receiving end 28, thereby forming a connection between bump 30 and bump 28 when device 16 and interposer 12 are connected together such that bumps 28 and 30 interface. This creates a physical connection between substrate 18 and device 16. This configuration allows bumps 28, 30 to slide against one another, permitting convenient coupling of bumps 28, 30 together as well as removal of bumps 28, 30 one from another.

Figure 7:
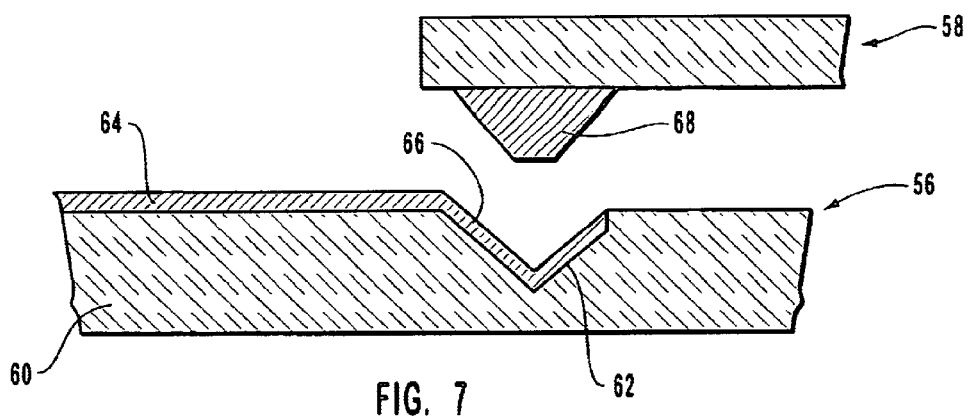
FIG. 7 is a cross-sectional, cut-away view of another embodiment of a semiconductive device and interposer.

In another embodiment, as shown in FIG. 7, the electrical connection between an interposer 59 and a semiconductive device 58 is created by providing for a complimentary, male/female connection between device 58 and interposer 59. Although interposer 59 is shown as comprising the female fitting, the interposer may comprise the male fitting, as shown in FIG. 6 with protruding bumped receiving end 28, while the semiconductive device comprises the female fitting which is formed in a recess of the semiconductive device.

In the embodiment shown in FIG. 7, interposer 59 comprises a substrate 60 having a recess 62 therein. A conductor 64 such as a metal trace is placed on substrate 60 such that a receiving end 66 of conductor 64 is disposed within recess 62, which is below the upper surface of substrate 60, allowing a male connecting terminal 68 of a conductor on semiconductive device 58 to be electrically coupled with receiving end 66 by being placed therein. Conductor 64 also has a terminal end (not shown) for connecting to an electrical apparatus. A connector such as connector 14, 44, or 56 may then be placed to bias device 58 towards substrate 60 to thereby retain the electrical connection between bump 68 and recessed receiving end 66. It will be appreciated that the male/female complimentary fit shown in FIG. 7 would be advantageous because of the structural integrity and non-slip design derived therefrom.

According to one method of manufacturing interposer 12 or 59, a substrate 18 or 60 of the present invention is provided comprising a ceramic material. At least one electrical conductor 20 or 64 is then coupled onto the substrate. In one embodiment, recess 62 is formed within substrate 60, such as through etching, and at least a portion of conductor 64 is placed within the recess 62. A recess may be formed to receive receiving end 66, as shown in FIG. 7, the entire conductor, an intermediate portion of conductor 64 and end 66, or a variety of other portions of conductor 64.

Figure 8:
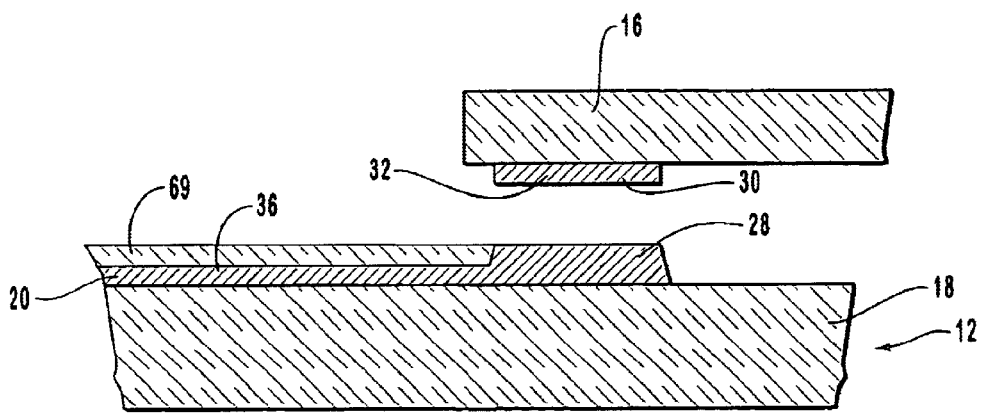
FIG. 8 is a cross sectional, cut away view of the interposer of FIG. 1 having an insulating layer on the intermediate portion of a conductor thereof.

As yet another feature of the invention, as shown in FIG. 8, it is possible to form a layer 69, such as a coating, of an electrically insulating material on the intermediate portion 36 of electrical conductor 20 of interposer 12. The electrically insulating material for layer 69 may comprise an electrically insulating material, such as a polymer or resin.

In one embodiment, the electrically insulating material is thermally conductive, such as a ceramic material such as described above (e.g., glass, aluminum nitride or alumina), for example. Thus, in one embodiment, layer 69 electrically insulates conductor 20 from contact with an electrical conductor, such as an uninsulated connector, and simultaneously aids in heat dissipation.

Figure 9:
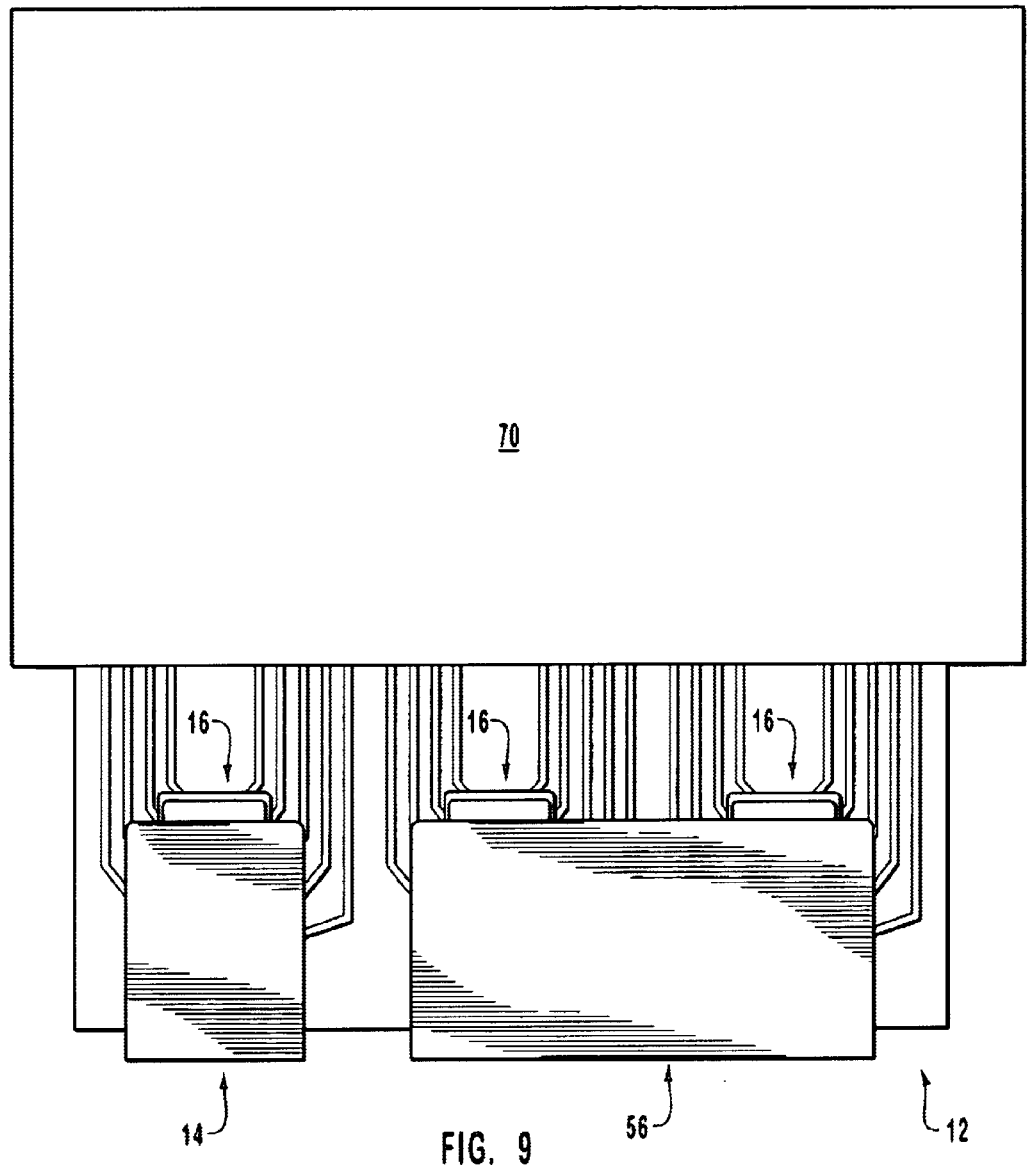
FIG. 9 is a schematic view of an electrical apparatus shown as receiving the interposer kit shown in FIG. 5.

With reference now to FIG. 9, interposer 12 having semiconductive devices 16 electrically coupled thereto through the use of connectors 14, 56 is electrically coupled to an electrical apparatus 70 such as a testing apparatus shown in a diagrammatic view in FIG. 9. Interposer 12 may be permanently or removably coupled to apparatus 70.

As used throughout this specification and the appended claims, the term "electrical apparatus" refers to an apparatus which electrically couples to a semiconductive device. Examples of such apparatuses include a computer, program logic controller, electronic game assembly, a controlling module, and a testing apparatus which monitors, tests, or evaluates a semiconductive device. The testing apparatus may be a computerized testing apparatus, for example.

Apparatus 70 includes a socket, such as a printed circuit board socket, having electrical terminals onto which terminal ends 34 of conductors 20 of interposer 12 are placed. After terminal ends 34 of interposer 12 are placed into the socket, an electrical connection exists between semiconductive devices 16 and apparatus 70, thereby allowing a user to test device 16 or otherwise engage in a variety of different functions.

Thus, one method for testing semiconductive device comprises providing an interposer having substrate comprised of an electrically insulating, thermally conductive ceramic material, electrically coupling the interposed to a semiconductive device, electrically coupling the interposer to a testing apparatus such that the testing apparatus is electrically coupled to semiconductive device, and then actuating the testing apparatus to electrically communicate with the semiconductive device.

A variety of different semiconductive devices may be electrically coupled to the inventive interposer. Examples of such semiconductive devices include DRAMs, SRAMs, integrated circuit devices, and the like, each of which has electrical conductors thereon such as bumps, lead fingers, or other package connections. The semiconductive devices, however, may be either packaged or non-packaged.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for testing a semiconductive device, comprising:
  providing an electrical testing apparatus;
  providing a container that contains a semiconductive device having electrical circuitry, the electrical circuitry being electrically connected to an electrical lead projecting out of the container;
  providing an interposer comprising:
    a substrate composed of an electrically insulating ceramic material, the substrate having an outermost surface and being configured for receiving thereon the semiconductive device such that said semiconductive device lies at least in part on said outermost surface and is unimbedded into said substrate, an electrical conductor on the substrate, the electrical conductor having a receiving end and a terminal end, and a connector for holding the semiconductive device stationary relative to the interposer by contact engagement with said semiconductive device and with said substrate, wherein said contact engagement is effectuated through direct contact between the connector with the semiconductor device or through an adhesive in contact with said connector, and wherein at least some of said terminals are located in the region between said semiconductive device and said outermost surface of said substrate;

connecting the receiving end of the electrical conductor to the electrical lead of the semiconductive device, wherein said receiving end and said electrical lead are connected and free of contact engagement with any other element other than said substrate and said semiconductor device;

connecting the terminal end of the electrical conductor to the electrical testing apparatus such that the electrical circuitry of the semiconductive device is in electrical communication with the electrical testing apparatus; and performing an electrical test upon the electrical circuitry of the semiconductive device with the electrical testing apparatus.

2. A method for testing a semiconductive device, comprising:

providing an electrical testing apparatus;

providing a container that contains a semiconductive device having electrical circuitry, the electrical circuitry being electrically connected to a plurality of electrical leads projecting out of the container;

providing an interposer comprising:

a substrate composed of an electrically insulating ceramic material, the substrate having an outermost surface and being configured for receiving thereon the semiconductive device such that said semiconductive device lies at least in part on said outermost surface, and is unimbedded into said substrate, a plurality of electrical conductors on the substrate, each electrical conductor having a receiving end and a terminal end, and a connector for holding the semiconductive device stationary relative to the interposer by contact engagement with said semiconductive device and with said substrate, wherein said contact engagement is effectuated through direct contact between the connector with the semiconductor device or through an adhesive in contact with said connector, and wherein at least some of said terminals are located in the region between said semiconductive device and said outermost surface of said substrate;

connecting the receiving end of each electrical conductor to an electrical lead of said plurality of the electrical leads, wherein said receiving end and said electrical lead are connected and free of contact engagement with any other element other than said substrate and said semiconductor device;

connecting each terminal end of the plurality of electrical conductors to the electrical testing apparatus such that the electrical circuitry of the semiconductive device is in electrical communication with the electrical testing apparatus; and performing an electrical test upon the electrical circuitry of the semiconductive device with the electrical testing apparatus.

3. A method for testing a semiconductive device, comprising:

providing an electrical testing apparatus;

providing a semiconductive device having an electrical circuitry therein electrically connected to an electrical lead projecting therefrom;

providing an interposer comprising:

a substrate composed of an electrically insulating material selected from the group consisting of glass, alumina, glass ceramic, nonmetallic nitride, aluminum nitride, nonmetallic carbide, and mixtures and derivatives thereof, the substrate having an outermost surface and being configured for receiving thereon the semiconductive device such that said semiconductive device lies at least in part on said outermost surface, and is unimbedded into said substrate;

an electrical conductor on the substrate, the electrical conductor having a receiving end and a terminal end; and a connector for holding the semiconductive device stationary relative to the interposer by contact engagement with said semiconductive device and with said substrate, wherein said contact engagement is effectuated through direct contact between the connector with the semiconductor device or through an adhesive in contact with said connector, and wherein at least some of said terminals are located in the region between said semiconductive device and said outermost surface of said substrate;

connecting the receiving end of the electrical conductor to the electrical lead of the semiconductive device, wherein said receiving end and said electrical lead are connected and free of contact engagement with any other element other than said substrate and said semiconductor device;

connecting the terminal end of the electrical conductor to the electrical testing apparatus such that the electrical circuitry of the semiconductive device is in electrical communication with the electrical testing apparatus; and performing an electrical test upon the electrical circuitry of the semiconductive device with the electrical testing apparatus.

4. A method as defined in claims 3, wherein connecting the receiving end of the electrical conductor to the electrical lead of the semiconductive device comprises:

covering a portion of the semiconductive device with the connector and leaving another portion of the semiconductive device exposed to the ambient so as to dissipate heat thereto, wherein the electrical lead is held towards and in contact with the receiving end by biasing said semiconductive device with said connector against said interposer.

5. A method as defined in claim 4, wherein the connector biases the receiving end of the electrical conductor to the electrical lead of the semiconductive device.

6. A method as defined in claim 4, wherein the connector has a coating thereon comprising an electrically insulating material.

7. A method as defined in claim 4, wherein the connector comprises a resilient biasing clip.

8. A method as defined in claim 4, wherein the connector is composed of metal material and has substantially parallel upper and lower plates so that a substantial portion of either the upper plate or the lower plate is in contact with the semiconductor device or is in contact with an adhesive disposed between the upper plate or the lower plate and the semiconductor device.

9. A method as defined in claim 3, wherein performing an electrical test upon the electrical circuitry of the semiconductive device with the electrical testing apparatus comprises:
the electrical testing apparatus storing information on the electrical circuitry of the semiconductive device; and
the electrical testing apparatus retrieving the information from the electrical circuitry of the semiconductive device.

10. A method for testing a semiconductive device, comprising:
providing an electrical testing apparatus;
providing a container that contains a semiconductive device having electrical circuitry, the electrical circuitry being electrically connected to a plurality of electrical leads projecting out of the container;
providing an interposer comprising:
a substrate comprised of an electrically insulating ceramic material, the substrate having an outermost surface being configured for receiving thereon the semiconductive device such that said semiconductive device lies at least in part on said outermost surface, and is unimbedded into said substrate; and
a plurality of electrical conductors on the substrate, each electrical conductor having a receiving end for connecting to the semiconductive device and a terminal end for connecting to the electrical testing apparatus, such that electrical circuitry within the semiconductive device is electrically coupled to the electrical apparatus when the semiconductor device is connected to said plurality of receiving ends of the electrical conductors and said plurality of terminal ends of the electrical conductors are connected to the electrical testing apparatus;
providing a connector for holding the interposer stationary relative to the semiconductive device by contact engagement with said semiconductive device and with said substrate, the connector covering a portion of the semiconductive device and another portion of the semiconductive device being exposed to the ambient so as to dissipate heat thereto, wherein the electrical lead is held towards and in contact with the receiving end by biasing said connector with said semiconductive device against said interposer, and wherein said connector is in contact with said semiconductive device and with said substrate, wherein said contact engagement is effectuated through direct contact between the connector with the semiconductor device or through an adhesive in contact with said connector;
connecting the receiving end of each said electrical conductor to a respective electrical lead of the semiconductive device, wherein said receiving end and said electrical lead are connected and free of contact engagement with any other element other than said substrate and said semiconductor device;
connecting the terminal end of each said electrical conductor to the electrical testing apparatus such that the electrical circuitry of the semiconductive device is in electrical communication with the electrical testing apparatus; and
performing an electrical test upon the electrical circuitry of the semiconductive device with the electrical testing apparatus.

11. A method as recited in claim 10, wherein at least one of said receiving ends projects from the substrate.

12. The method as defined in claim 10, wherein each said receiving end protrudes upwardly with respect to the substrate.

13. A method as recited in claim 10, wherein at least one of said receiving ends is disposed within a recess in the substrate.

14. The method as defined in claim 10 wherein each said receiving end is disposed within a recess in the substrate.

15. The method as defined in claim 10, wherein the interposer further comprises an electrically insulating layer on a portion of the conductor between the receiving end and the terminal end.

16. The method as defined in claim 15, wherein the electrically insulating layer comprises a thermally conductive material.

17. The method as recited in claim 10, wherein the connector removably connects the semiconductive device to the interposer.

18. A method as recited in claim 10, wherein the connector comprises a resilient biasing clip.

19. A method as recited in claim 10, wherein the connector is composed of a metal material and has substantially parallel upper and lower plates so that a substantial portion of either the upper plate or the lower plate is in contact with the semiconductor device or is in contact with an adhesive disposed between the upper plate or the lower plate and the semiconductor device.

20. A method as recited in claim 10, further comprising an adhesive on at least a portion of said outermost surface and between said at least a portion of said outermost surface and said semiconductive device.

21. The method as defined in claim 10, wherein the substrate comprises a substantially planar sheet.

22. The method as defined in claim 10, wherein the substrate comprises a substantially homogenous material.

23. The method as defined in claim 10, wherein the substrate comprises a material selected from the group consisting of glass, alumina, glass ceramic, nonmetallic nitride, aluminum nitride, nonmetallic carbide, and mixtures and derivatives thereof.

24. The method as defined in claim 10, wherein the substrate comprises boron nitride.

25. The method as recited in claim 10, wherein the substrate comprised of an electrically insulating ceramic material further comprises a substantially homogeneous, substantially planar sheet composed of an electrically insulating material selected from the group consisting of glass ceramics, devitrified ceramics, vitro ceramics, alumina, single oxide ceramics, and mixed oxide ceramics, and mixtures and derivatives thereof.

26. The method as recited in claim 10, wherein the substrate comprised of an electrically insulating ceramic material further comprises a substantially homogeneous, substantially planar sheet composed of an electrically insulating material selected from the group consisting of boron nitrides, aluminum nitrides, and mixtures and derivatives thereof.

27. The method as recited in claim 10, wherein the substrate comprised of an electrically insulating ceramic material further comprises a substantially homogeneous, substantially planar sheet composed of an electrically insulating material selected from the group consisting of oxides of silicon, silicate glass, and nucleated, substantially crystalline glass, and mixtures and derivatives thereof.

* * * * *

UNITED STATES PATENT AND TRADEMARK OFFICE
CERTIFICATE OF CORRECTION

PATENT NO. : 6,690,188 B2  Page 1 of 1
DATED : February 10, 2004
INVENTOR(S) : Leonard E. Mess It is certified that error appears in the above-identified patent and that said Letters Patent is hereby corrected as shown below:

Title page,
Line 1, insert -- of -- after "method"

Column 2,
Line 4, change "sufficient" to -- sufficiently --

Column 4,
Line 67, insert -- , -- after "fine-grained"

Column 6,
Line 11, change "allowing" to -- allows --

Column 8,
Line 30, insert -- a -- after "testing"
Line 33, change "interposed" to -- interposer --

Column 10,
Line 50, change "claims" to -- claim --

Column 12,
Line 36, change "homogenous" to -- homogeneous --

Signed and Sealed this

Thirteenth Day of July, 2004

JON W. DUDAS
*Acting Director of the United States Patent and Trademark Office*